(12) United States Patent
Hirasawa

(10) Patent No.: US 10,727,449 B2
(45) Date of Patent: Jul. 28, 2020

(54) LIGHT-EMITTING DEVICE

(71) Applicant: Pioneer Corporation, Bunkyo-ku, Tokyo (JP)

(72) Inventor: Akira Hirasawa, Tokyo (JP)

(73) Assignee: PIONEER CORPORATION, Bunkyo-Ku, Tokyo (JP)

( * ) Notice: Subject to any disclaimer, the term of this patent is extended or adjusted under 35 U.S.C. 154(b) by 0 days.

(21) Appl. No.: 16/310,784

(22) PCT Filed: Jun. 24, 2016

(86) PCT No.: PCT/JP2016/068921
§ 371 (c)(1),
(2) Date: Dec. 17, 2018

(87) PCT Pub. No.: WO2017/221424
PCT Pub. Date: Dec. 28, 2017

(65) Prior Publication Data
US 2019/0319220 A1    Oct. 17, 2019

(51) Int. Cl.
*H01L 51/52* (2006.01)
*H01L 27/32* (2006.01)
*H01L 51/00* (2006.01)

(52) U.S. Cl.
CPC ...... *H01L 51/5284* (2013.01); *H01L 27/3202* (2013.01); *H01L 51/0085* (2013.01);
(Continued)

(58) Field of Classification Search
CPC ............... H01L 51/5284; H01L 51/524; H01L 51/0092; H01L 51/0091; H01L 51/0085;
(Continued)

(56) References Cited

U.S. PATENT DOCUMENTS 5,851,709 A    12/1998   Grande et al.
8,319,419 B2   11/2012   Kodama et al.
(Continued)

FOREIGN PATENT DOCUMENTS

JP    S61-245491 A    10/1986
JP    H11-237504 A    8/1999
(Continued)

OTHER PUBLICATIONS

International Search Report for related International Application No. PCT/JP2016/068921 dated Sep. 27, 2016; 2 pages.

*Primary Examiner* — Thanh T Nguyen
(74) *Attorney, Agent, or Firm* — Procopio, Cory, Hargreaves & Savitch LLP

(57) ABSTRACT

A light-emitting device (10) includes a light-transmitting first base material (210), a light-transmitting second base material (220), and a plurality of light-emitting units (140). The light-emitting units (140) are located between the first base material (210) and the second base material (220). The light-emitting units (140) emit light having a peak at a first wavelength. In addition, the light-emitting device (10) includes a light-transmitting region located between the plurality of light-emitting units (140). Further, the second base material (220) includes an absorption layer (170). The absorption layer (170) is a layer that particularly absorbs light of the first wavelength.

13 Claims, 14 Drawing Sheets

(52) U.S. Cl.
CPC ...... *H01L 51/0091* (2013.01); *H01L 51/0092* (2013.01); *H01L 51/524* (2013.01)

(58) Field of Classification Search
CPC ............. H01L 27/3202; H01L 51/5253; H01L 27/3283; H01L 27/326; H01L 51/5281; H05B 33/02; H05B 33/04
See application file for complete search history.

(56) References Cited

U.S. PATENT DOCUMENTS

| | | | | |
|---|---|---|---|---|
| 2004/0156405 | A1* | 8/2004 | Asai | H01L 51/5265 372/39 |
| 2007/0057264 | A1* | 3/2007 | Matsuda | H01L 27/3211 257/88 |
| 2009/0072709 | A1* | 3/2009 | Kobayashi | H01L 27/3206 313/503 |
| 2010/0078629 | A1* | 4/2010 | Yokoyama | H01L 51/5036 257/40 |
| 2010/0314616 | A1 | 12/2010 | Kodama et al. | |

FOREIGN PATENT DOCUMENTS

| | | |
|---|---|---|
| JP | 2000-100559 A | 4/2000 |
| JP | 2000-315582 A | 11/2000 |
| JP | 2005-108540 A | 4/2005 |
| JP | 2007-048772 A | 2/2007 |
| JP | 2011-023336 A | 2/2011 |

\* cited by examiner

LIGHT-EMITTING DEVICE

CROSS-REFERENCE TO RELATED APPLICATIONS

This application is a U.S. National Stage entry of PCT Application No: PCT/JP2016/068921 filed Jun. 24, 2016, the contents of which are incorporated herein by reference.

TECHNICAL FIELD

The present invention relates to a light-emitting device.

BACKGROUND ART

In recent years, there has been progress in the development of light-emitting devices using organic EL. Such light-emitting devices are used as illumination devices or display devices and configured of an organic layer interposed between a first electrode and a second electrode. Generally, a transparent material is used for the first electrode, and a metal material is used for the second electrode.

One of the light-emitting devices which utilizes the organic EL is a technology described in Patent Document 1. In order to provide a display device using organic EL with optical transparency (or a see-through property), the technology in Patent Document 1 provides the second electrode only in a portion of a pixel. In such a configuration, since a region located between a plurality of second electrodes transmits light, the organic EL element may have light-transmitting properties.

RELATED ART DOCUMENT

Patent Document

[Patent Document 1]: Japanese Unexamined Patent Application Publication No. 2011-23336

SUMMARY OF THE INVENTION

In a light-emitting device of a light-transmitting type in which light is desired to be extracted only from one surface (a front surface), there is a case where a portion of the light leaks out also from a surface on the opposite side (a rear surface). In this case, visually recognizing the opposite side from the rear surface side through the light-emitting device may become difficult, and light extraction efficiency from the front surface may decrease.

An example of the problem to be solved by the present invention is to reduce a leakage of light from a surface opposite to a light-emitting surface in a light-transmitting-type light-emitting device.

Means for Solving the Problem

The invention described in claim 1 is a light-emitting device including:

a plurality of light-emitting units located between a light-transmitting first base material and a light-transmitting second base material, the light-emitting units emitting light having a peak at a first wavelength; and a light-transmitting region located between the plurality of light-emitting units, in which the second base material includes an absorption layer, and in which the absorption layer has a higher light absorption ratio at the first wavelength than an average light absorption ratio within a wavelength range of equal to or higher than 400 nm and equal to or lower than 700 nm.

The invention described in claim 2 is a light-emitting device including:

a plurality of light-emitting units located between a light-transmitting first base material and a light-transmitting second base material, the light-emitting units emitting light having a peak at a first wavelength; and a light-transmitting region located between the plurality of light-emitting units, in which the second base material includes an absorption layer, and in which an absorption ratio of the absorption layer with respect to light within a wavelength range between two wavelengths as upper and lower limits each having an intensity of one half of a peak intensity of the peak at the first wavelength is equal to or greater than 10%.

The invention described in claim 3 is a light-emitting device including:

a plurality of light-emitting units located between a light-transmitting first base material and a light-transmitting second base material, the light-emitting units emitting light having a peak at a first wavelength; and a light-transmitting region located between the plurality of light-emitting units, in which the second base material includes an absorption layer, and in which the absorption layer has an absorption peak within a wavelength range between two wavelengths as upper and lower limits each having an intensity of one half of a peak intensity of the peak at the first wavelength.

The invention described in claim 4 is a light-emitting device including:

a plurality of light-emitting units located between a light-transmitting first base material and a light-transmitting second base material, the light-emitting units emitting light having a peak at a first wavelength; and a light-transmitting region located between the plurality of light-emitting units, in which the second base material includes an absorption layer, and in which the first wavelength is contained within a wavelength range between two wavelengths as upper and lower limits each having an absorption intensity of one half of a peak intensity at a maximum light absorption peak of the absorption layer.

BRIEF DESCRIPTION OF THE DRAWINGS

The objects described above, and other objects, features and advantages are further made apparent by a suitable embodiment that will be described below and the following accompanying drawings.

DESCRIPTION OF EMBODIMENT

Figure 1:
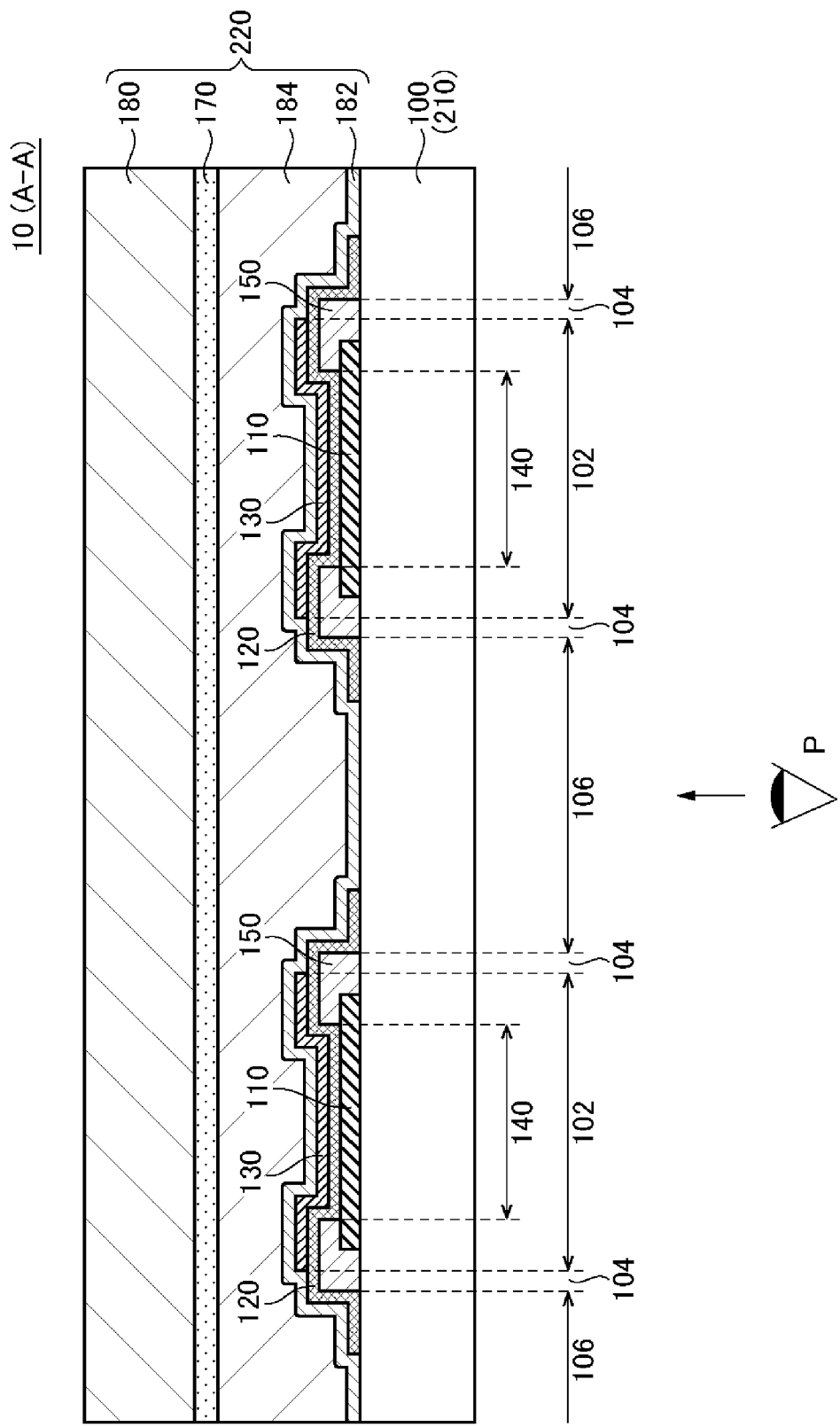
FIG. 1 is a cross-sectional view of a configuration of a light-emitting device according to a first embodiment.

An embodiment of the present invention will be described below by referring to the drawings. Moreover, in all the drawings, the same constituent elements are given the same reference numerals, and descriptions thereof will not be repeated.

First Embodiment

Figure 2:
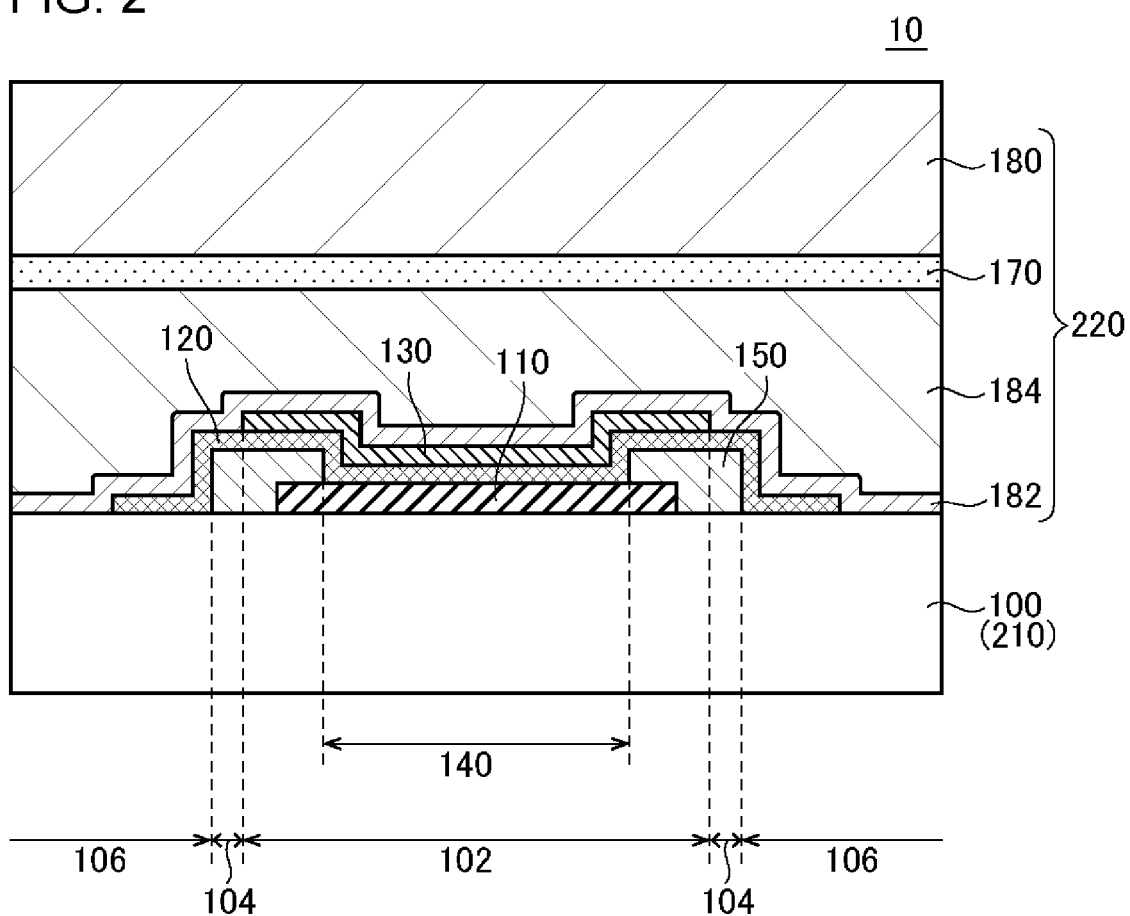
FIG. 2 is an enlarged view of a light-emitting unit of a light-emitting device.

FIG. 1 is a cross-sectional view of a configuration of a light-emitting device 10 according to a first embodiment. An observer P observes a light-emitting surface of the light-emitting device 10 from a direction perpendicular to a substrate 100 in FIG. 1. FIG. 2 is an enlarged view of a light-emitting unit 140 of the light-emitting device 10.

The light-emitting device 10 includes a plurality of light-emitting units 140 located between a light-transmitting first base material 210 and a light-transmitting second base material 220. The light-emitting units 140 emit light having a peak at a first wavelength. In addition, the light-emitting device 10 includes a light-transmitting region located between the plurality of light-emitting units 140. Further, the second base material 220 includes an absorption layer 170.

Meanwhile, that the second base material 220 includes the absorption layer 170 means that the light-emitting unit 140 is located between the first base material 210 and the absorption layer 170. That is, in a manufacturing process or the like of the light-emitting device 10, the absorption layer 170 may be a layer formed on the first base material 210, or may be a layer having a portion thereof in contact with the first base material 210.

The absorption layer 170 will be described below. As long as the absorption layer 170 is a layer which particularly absorbs light of the first wavelength, it is not particularly limited, and is, for example, is a layer which corresponds to at least any of absorption layers described in a first example to a fifth example below. In the following, the first wavelength is a maximum peak in the emission spectrum of the light-emitting unit 140. Here, the emission spectrum of the light-emitting unit 140 is obtained by, for example, measuring light outputted from an output surface on a first base material 210 side of the light-emitting device 10. Further, an absorption spectrum of the absorption layer 170 is obtained by, for example, acquiring a reflection spectrum and a transmission spectrum of light irradiated on the second base material 220 side of the light-emitting device 10 and thereafter subtracting the transmission spectrum and the reflection spectrum from the spectrum of the irradiated light. In addition, since the first base material 210 and the second base material 220 have light-transmitting properties, a structure including the absorption layer 170 may be cut out from the light-emitting device 10 and a light absorption ratio measured from the structure may be regarded as the light absorption ratio of the absorption layer 170. In the example in the present drawing, for example, an adhesive layer 184 may be cut to obtain a structure including the sealing member 180, the absorption layer 170, and a portion of the adhesive layer 184, allowing the structure to be used as an object of measurement. A measuring range of the emission spectrum and the absorption spectrum is, for example, from 400 nm to 700 nm.

In the first example, the absorption layer 170 has a higher light absorption ratio at the first wavelength than a mean value (an average absorption ratio) of a light absorption ratio within a wavelength range of, for example, equal to or greater than 400 nm and equal to or less than 700 nm. Here, the average absorption ratio of the absorption layer 170 may be obtained by, for example, calculating each absorption ratio of the absorption layer 170 for light of a plurality of wavelengths and obtaining the mean value thereof.

In a second example, at the peak including the first wavelength in the emission spectrum of the light-emitting unit 140, a wavelength range between two wavelengths each having half of an intensity of the peak intensity as upper and lower limits is set as a first range. In addition, the absorption ratio of the absorption layer 170 with respect to light within the first range is equal to or greater than 10%.

Figure 3:
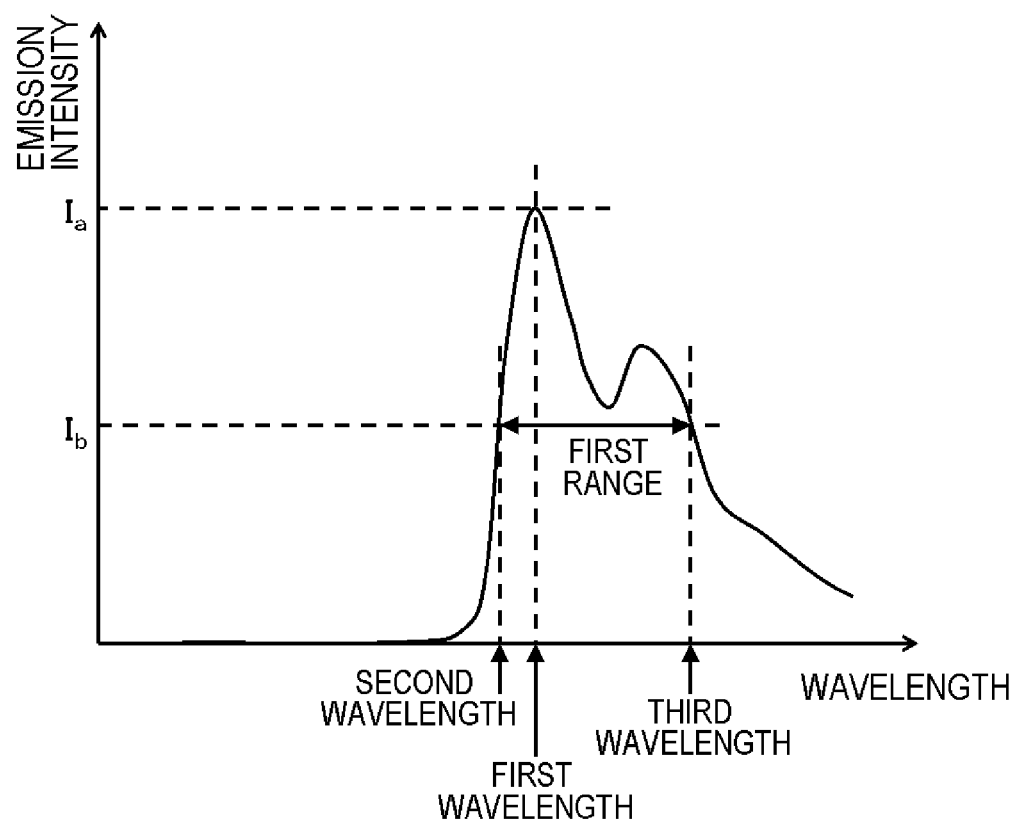
FIG. 3 is a diagram of an example of an emission spectrum of a light-emitting unit.

FIG. 3 is a diagram of an example of an emission spectrum of the light-emitting unit 140. The second example will be described using the present diagram. In the emission spectrum illustrated in the present diagram, the maximum peak is included in the first wavelength. The peak intensity of the first wavelength is $I_a$. Further, in the present diagram, an emission intensity $I_b$ is one half of $I_a$. The base of the peak of the first wavelength becomes the intensity $I_b$ at a second wavelength and a third wavelength. The second wavelength is shorter than the third wavelength. Here, the wavelength range between the second wavelength as a lower limit and the third wavelength as an upper limit is the first range. Further, in the second example, the absorption ratio of the absorption layer 170 is equal to or greater than 10% throughout the entirety of the first range. In addition, the absorption ratio of the absorption layer 170 is preferably equal to or greater than 30%, and is more preferably equal to or greater than 50% throughout the entirety of the first range.

Meanwhile, in a case where the emission spectrum of the light-emitting unit 140 has the above-mentioned intensity $I_b$ at three or more wavelengths, out of these wavelengths, the second wavelength is set to the wavelength that is shorter than the first wavelength and the nearest to the first wavelength. Further, out of these wavelengths, the third wavelength is set to the wavelength that is longer than, and the nearest to the first wavelength. Meanwhile, in the first range, at a wavelength other than the first wavelength, another emission peak may further exist.

In a case where the absorption layer 170 is formed in a region overlapping a light-transmitting region when viewed from the direction perpendicular to the substrate 100, the light absorption ratio of the absorption layer 170 is preferably equal to or less than 90%, and is more preferably equal to or less than 80% throughout the entirety of the first range. Then, it is possible to secure even higher optical transparency of the light-emitting device 10.

In a third example, the absorption layer 170 is a layer including an absorption peak in the first range which was explained in the second example. Particularly, it is preferable that the maximum absorption peak in the light absorption spectrum of the absorption layer 170 is located in the first range.

In a fourth example, a wavelength range between two wavelengths as upper and lower limits each having an absorption intensity of one half of a peak intensity at the maximum light absorption peak of the absorption layer 170 is a second range. Further, the first wavelength is included in the second range.

Figure 4:
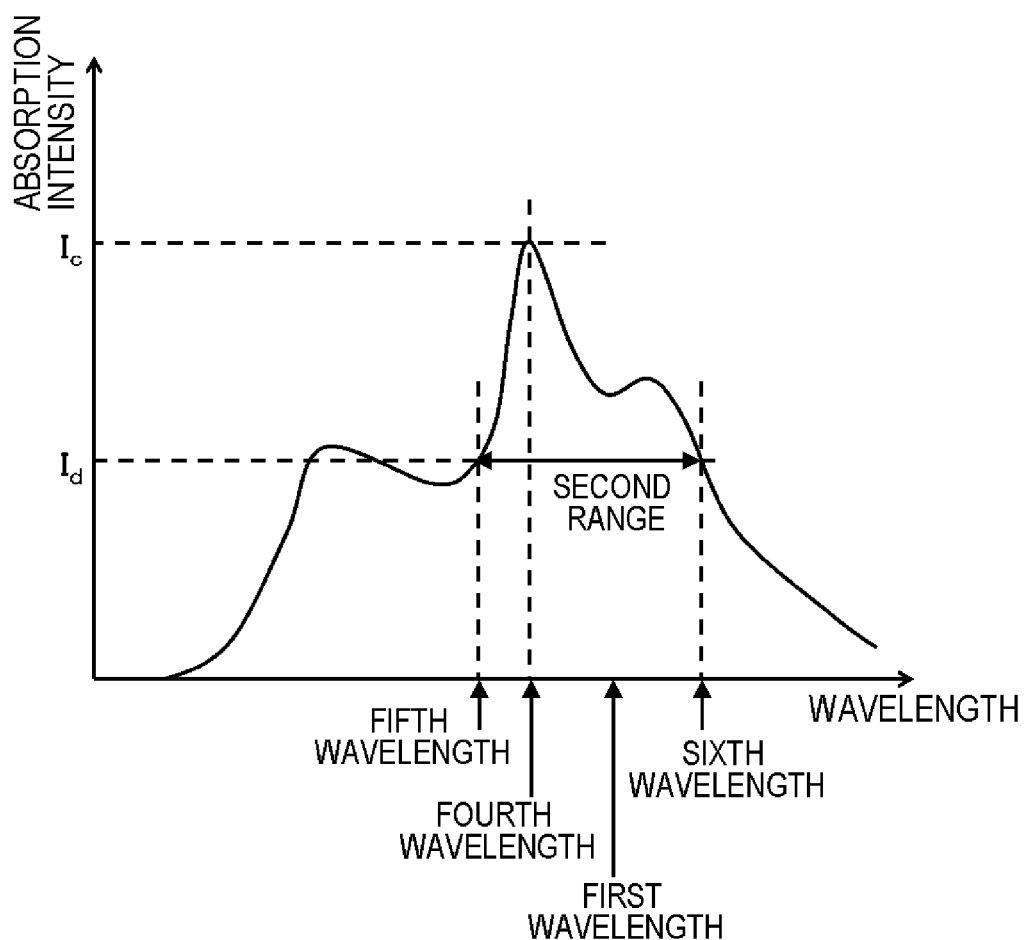
FIG. 4 is a diagram of an example of an absorption spectrum of an absorption layer.

FIG. 4 is a diagram of an example of the absorption spectrum of the absorption layer 170. The fourth example will be described using the present diagram. The absorption spectrum illustrated in the present diagram includes the maximum absorption peak having a fourth wavelength as the peak wavelength. The magnitude (intensity) of the peak in the absorption spectrum is proportional to the light absorption ratio of the absorption layer 170. The peak intensity at the fourth wavelength is $I_c$. Further, in the present diagram, the magnitude of an absorption intensity $I_d$ is one half of $I_c$. The base of the peak of the fourth wavelength becomes an intensity $I_d$ at a fifth wavelength and at a sixth wavelength. The fifth wavelength is shorter than the sixth wavelength. Here, a wavelength range between the fifth wavelength as a lower limit and the sixth wavelength as an upper limit is the second range. In addition, in the fourth example, the first wavelength as the emission spectrum peak wavelength of the light-emitting unit 140 is included in the second range.

Meanwhile, in a case where the absorption spectrum of the absorption layer 170 is the above-mentioned intensity $I_d$ at three or more wavelengths, a wavelength out of these wavelengths that is shorter than the fourth wavelength and the nearest to the fourth wavelength is the fifth wavelength. Further, out of these wavelengths, a wavelength that is longer than, and the nearest to the fourth wavelength is the sixth wavelength. Further, in the second range, at a wavelength other than the fourth wavelength, another absorption peak may further exist.

In the fifth example, a difference between a wavelength having the maximum absorption intensity of the absorption spectrum of the absorption layer 170 and the first wavelength as the emission spectrum peak wavelength of the light-emitting unit 140 is equal to or less than 100 nm. In addition, a difference between a wavelength having the maximum absorption intensity of the absorption spectrum of the absorption layer 170 and the first wavelength as the emission spectrum peak wavelength of the light-emitting unit 140 is preferably equal to or less than 50 nm.

Further, in the above-mentioned first example to fifth example, at a wavelength shorter than the first wavelength by 100 nm and a wavelength longer than the first wavelength by 100 nm, the light absorption ratio of the absorption layer 170 is preferably equal to or less than 50% and is more preferably equal to or less than 20%. Then, the absorption layer 170 can sufficiently transmit light of a wavelength which is distant from the first wavelength. Further, the absorption layer 170 preferably has a light transmittance of wavelength in a certain wavelength band including the first wavelength out of visible light that is lower than the light transmittance of light in a wavelength band other than the certain wavelength band. The certain wavelength band is in a range from, for example, a wavelength shorter than the first wavelength by 50 nm to a wavelength longer than the first wavelength by 50 nm.

Figure 5:
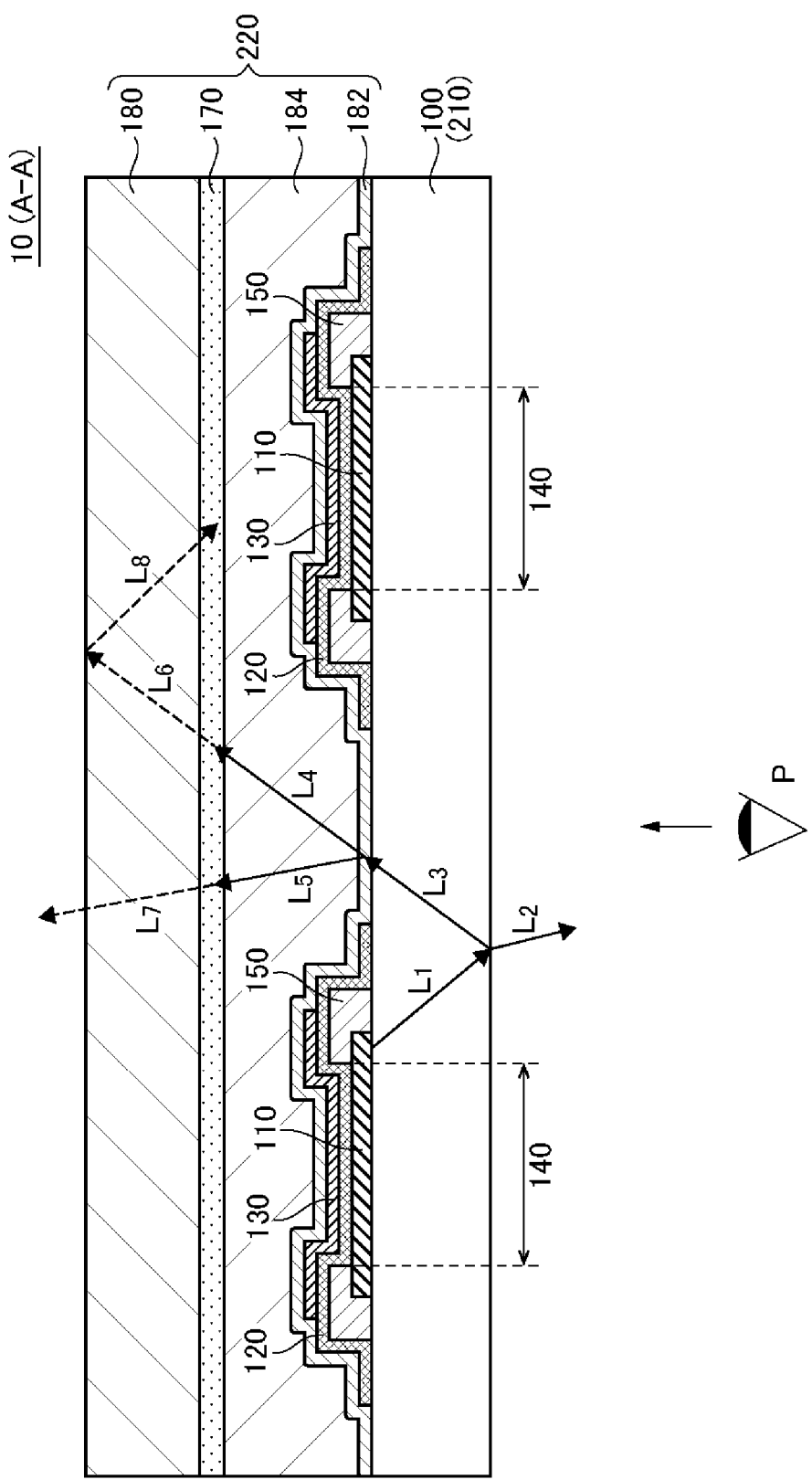
FIG. 5 is a diagram of a first example of a light path in a light-emitting device.

FIG. 5 is a diagram of a first example of a light path in the light-emitting device 10. Hereinafter, the first base material 210 side of the light-emitting device 10 is called "a front surface", and the second base material 220 side is called "a rear surface". In a case where an angle incident on an interface between the substrate 100 and a gas phase is smaller than a critical angle, light $L_1$ outputted from the light-emitting unit 140 and advanced to the substrate 100 side is mainly outputted to the outside of the light-emitting device 10 as light $L_2$. Meanwhile, in a case where the incident angle is larger than the critical angle, $L_1$ is totally reflected and advances to the rear surface side as light $L_3$. Further, for example, the light $L_3$ may change the advancing direction when passing through a member having diffusibility as light $L_5$, becoming an angle that is easily outputted to the rear surface of the light-emitting device 10. In this case also, since the light-emitting device 10 in the present embodiment includes the absorption layer 170, a portion of light $L_5$ passing through is absorbed, and it is possible to reduce light $L_7$ leaked from the rear surface. Further in the present drawing, there may be light having an angle which is totally reflected at the rear surface of the light-emitting device 10 such as light $L_4$ and light $L_6$. In this case, totally reflected light $L_8$ is incident again on the absorption layer 170, and thereby, the light intensity is decreased. Thus, by the absorption layer 170, it is possible to reduce light emitted from the light-emitting unit 140 from leaking from the rear surface side. Meanwhile, the absorption layer 170 allows to secure visibility from the rear surface side to the front surface side of the light-emitting device 10 by selectively absorbing light of the first wavelength.

Referring back to FIG. 1 and FIG. 2, each configuration of the light-emitting device 10 will be described in detail. In the present embodiment, the light-emitting device 10 includes the light-transmitting first base material 210 and the light-transmitting second base material 220. The second base material 220 includes a sealing film 182, the adhesive layer 184, the absorption layer 170, and the sealing member 180. The sealing member 180 covers the light-emitting unit 140 with the adhesive layer 184 interposed therebetween. In addition, in the present embodiment, the absorption layer 170 is in contact with the sealing member 180. In the example illustrated in FIG. 1 and FIG. 2, the absorption layer 170 is in contact with a surface of the sealing member 180 on the light-emitting unit 140 side. However, the absorption layer 170 may be in contact with a surface of the sealing member 180 on a side opposite to the light-emitting unit 140. The absorption layer 170 is in contact with the sealing member 180, and thereby light is absorbed further on the outer side than in a case where a light diffusing member exists between the sealing member 180 and the light-emitting unit 140. However, as long as the absorption layer 170 is included in the second base material 220, a location thereof is not particularly limited. In addition, a plurality of absorption layers 170 may be included in the second base material 220.

The first base material 210 in the present embodiment includes the substrate 100. The substrate 100 is a light-transmitting substrate, for example, a glass substrate or a resin substrate. The substrate 100 may have flexibility. In a case where the substrate has flexibility, the thickness of the substrate 100 is, for example, equal to or greater than 10 μm and equal to or less than 1,000 μm. The substrate 100 is polygonal, for example, rectangular, or circular. In a case where the substrate 100 is a resin substrate, the substrate 100 is formed using, for example, polyethylene naphthalate (PEN), polyether sulphone (PES), polyethylene terephthalate (PET), or polyimide. In addition, in a case where the substrate 100 is a resin substrate, an inorganic barrier film of $SiN_x$, $SiON$ or the like is preferably formed on at least one surface (preferably, both surfaces) of the substrate 100 in order to prevent moisture from permeating the substrate 100. In this case, the first base material 210 includes the substrate 100 and the inorganic barrier film.

The light-emitting unit 140 is formed on one surface of the substrate 100. The light-emitting unit 140 includes a light-transmitting first electrode 110, a light-shielding second electrode 130, and an organic layer 120 located between the first electrode 110 and the second electrode 130. Further, the second electrode 130 is located on the side of the first electrode opposite to the first base material 210. With such a configuration, light from the light-emitting unit 140 is outputted to the first base material 210 side. Meanwhile, a portion of the light emitted from the light-emitting unit 140 may be outputted to the second base material 220 side as, for example, leaked light. However, the light outputted to the first base material 210 side has higher intensity than the light emitted to the second base material 220 side.

In a case where the light-emitting device 10 is an illumination device, the plurality of light-emitting units 140 are linearly extended. On the other hand, in a case where the light-emitting device 10 is a display device, the plurality of light-emitting units 140 may be disposed to constitute a matrix or may be disposed to constitute segments or to display a predetermined shape (for example, an icon). Further, the plurality of light-emitting units 140 are formed in accordance with each pixel.

The first electrode 110 is a transparent electrode having optical transparency. A material of the transparent electrode is a material containing a metal, for example, a metal oxide formed of an indium tin oxide (ITO), an indium zinc oxide (IZO), an indium tungsten zinc oxide (IWZO), a zinc oxide (ZnO), or the like. The thickness of the first electrode 110 is, for example, equal to or greater than 10 nm and equal to or less than 500 nm. The first electrode 110 is formed by, for example, sputtering or vapor deposition. Meanwhile, the first electrode 110 may be a conductive organic material such as carbon nanotubes or PEDOT/PSS. In the drawing, a plurality of linear first electrodes 110 are formed in parallel to each other on the substrate 100, and the first electrode 110 is neither located in the second region 104 nor in the third region 106.

The organic layer 120 includes a light-emitting layer. The organic layer 120 has a configuration in which, for example, a hole injection layer, a light-emitting layer, and an electron injection layer are laminated in this order. A hole transport layer may be formed between the hole injection layer and the light-emitting layer. In addition, an electron transport layer may be formed between the light-emitting layer and the electron injection layer. The organic layer 120 may be formed by vapor deposition. In addition, at least one layer of the organic layer 120, for example, a layer which is in contact with the first electrode 110, may be formed using a coating method such as ink jetting, printing, or spraying. Meanwhile, in this case, the remaining layers of the organic layer 120 may be formed by vapor deposition, and in addition, all layers of the organic layer 120 may be formed using a coating method.

In a case where the emission color of the light-emitting unit 140 is red, the first wavelength is, for example, equal to or greater than 590 nm and equal to or less than 680 nm. In a case where the emission color of the light-emitting unit 140 is green, the first wavelength is, for example, equal to or greater than 490 nm and equal to or less than 580 nm. When the emission color of the light-emitting unit 140 is blue, the first wavelength is, for example, equal to or greater than 390 nm and equal to or less than 480 nm.

In a case where the emission color of the light-emitting unit 140 is red, the organic layer 120 includes, for example, BAlq and Btplr. In a case where the emission color of the light-emitting unit 140 is green, the organic layer 120 includes, for example, CBP and Ir(ppy)$_3$. In addition, in a case where the emission color of the light-emitting unit 140 is blue, the organic layer 120 includes, for example, CDBP and Flrpic.

The second electrode 130 includes a metal layer composed of a metal selected from a first group including, for example, Al, Au, Ag, Pt, Mg, Sn, Zn, and In, or an alloy of metals selected from the first group. In this case, the second electrode 130 has light shielding properties. The thickness of the second electrode 130 is, for example, equal to or greater than 10 nm and equal to or less than 500 nm. The second electrode 130 is formed by, for example, sputtering or vapor deposition. In the example shown in the drawing, the light-emitting device 10 includes a plurality of linear second electrodes 130. Each second electrode 130 is provided per each of the first electrodes 110, and the width thereof is wider than that of the first electrode 110. Therefore, in a case where viewed from a direction perpendicular to the substrate 100, in a width direction, the entirety of the first electrode 110 is overlapped and covered by the second electrode 130. In addition, the width of the first electrode 110 may be wider than that of the second electrode 130, and when viewed in the direction perpendicular to the substrate, the entirety of the second electrode 130 may be covered by the first electrode 110 in the width direction.

An edge of the first electrode 110 is covered by an insulating film 150. The insulating film 150 is formed of, for example, a photosensitive resin material such as polyimide and surrounds a portion of the first electrode 110 serving as the light emitting unit 140. An edge of the second electrode 130 in the width direction is located over the insulating film 150. In other words, when viewed from the direction perpendicular to the substrate 100, a portion of the insulating film 150 protrudes from the second electrode 130. In addition, in the example shown in the drawing, the organic layer 120 is formed over and on the side of the insulating film 150. Further, the organic layer 120 is divided in a region between the light-emitting units 140 next to each other. However, the organic layer 120 may be continuously provided across the light-emitting units 140 next to each other.

The light-emitting device 10 includes a first region 102, a second region 104, and a third region 106. When viewed from the direction perpendicular to the substrate 100, the first region 102 overlaps the second electrode 130. The second region 104 is a region which overlaps the insulating film 150, but does not overlap the second electrode 130. In the example illustrated in the present drawing, the organic layer 120 is also formed in the second region 104. The third region 106 neither overlaps the second electrode 130 nor the insulating film 150. The light-transmitting region is composed of the second region 104 and the third region 106. That is, the light-transmitting region is a region which does not overlap the second electrode 130 when viewed from a direction perpendicular to the first base material 210. In the example shown in the drawing, no organic layer 120 is formed in at least a portion of the third region 106. Further, for example, the width of the second region 104 is narrower than that of the third region 106. In addition, the width of the third region 106 may be wider or narrower than that of the first region 102. In a case where the width of the first region 102 is 1, the width of the second region 104 is, for example, equal to or greater than 0 (or more than 0) and equal to or less than 0.2, and the width of the third region 106 is, for example, equal to or greater than 0.3 and equal to or less than 2. Further, the width of the first region 102 is, for example, equal to or greater than 50 µm and equal to or less than 500 µm, the width of the second region 104 is, for example, equal to or greater than 0 µm (or more than 0 µm) and equal to or less than 100 µm, and the width of the third region 106 is, for example, equal to or greater than 15 µm and equal to or less than 1,000 µm.

The sealing film 182 is formed to cover the light-emitting unit 140. In the example shown in FIG. 1 and FIG. 2, the sealing film 182 is in contact with the second electrode 130, and when viewed from the direction perpendicular to the substrate 100, covers the entirety of the first region 102, the second region 104, and the third region 106.

An inorganic barrier film such as, for example, $SiN_x$, SiON, $Al_2O_3$, and $Tio_2$, or a barrier laminated film including these, or a mixed film of these may be used as the sealing film 182. These can be formed by a vacuum deposition method, for example, sputtering, CVD, ALD, and EB vapor deposition.

The planar shape of the substrate 100 is polygonal such as, for example, rectangular or the like, or circular. The sealing member 180 is light-transmitting and is formed using, for example, glass ora resin. Similarly to the substrate 100, the sealing member 180 has a polygonal or a circular shape, and has a concave portion at the center. In addition, each of the plurality of light-emitting units 140 is located inside the sealed space between the substrate 100 and the sealing member 180. An adhesive is filled in the sealed space, and the adhesive layer 184 is formed. In addition, the sealing member 180 may have a plate-like shape. In this case also, the sealing member 180 is fixed to the light-emitting unit 140 with the adhesive layer 184. As the adhesive layer 184, for example, an epoxy resin may be used.

In addition, in the present embodiment, the absorption layer 170 is formed on one surface of the sealing member 180. In the example shown in FIG. 1 and FIG. 2, the absorption layer 170 is located between the adhesive layer 184 and the sealing member 180, and is in contact with the adhesive layer 184 and the sealing member 180. However, the sealing member 180 may have the absorption layer 170 formed on at least one surface thereof. That is, the absorption layer 170 may be formed on both surfaces of the sealing member 180, or the absorption layer 170 may be provided only on a surface of the sealing member 180 on a side opposite to the light-emitting unit 140. Further, the absorption layer 170 is a layer which does not configure the light-emitting unit 140.

In the present embodiment, when viewed from the direction perpendicular to the first base material 210, the absorption layer 170 is provided to overlap the entirety of the first region 102, the second region 104, and the third region 106. That is, the absorption layer 170 is formed in a region overlapping the light-emitting unit 140 when viewed from the direction perpendicular to the first base material 210, and further formed in a region overlapping the light-transmitting region. Therefore, it is not necessary to conduct patterning on the absorption layer 170, and the absorption layer 170 may be formed easily.

The absorption layer 170 is configured including, for example, a light absorbing material. In a case where the emission color of the light-emitting unit 140 is red, as the light absorbing material, for example, a metal phthalocyanine such as copper phthalocyanine or zinc phthalocyanine may be used. In a case where the emission color of the light-emitting unit 140 is green, as the light absorbing material, for example, rubrene or pentacene may be used. In a case where the emission color of the light-emitting unit 140 is blue, as the light absorbing material, for example, coumarin dye such as coumarin 6 and coumarin 343, or naphthacene may be used. Among these, in a case where the organic layer 120 contains Btplr, the absorption layer 170 preferably includes a metal phthalocyanine. This is because, then, the matching degree between the emission spectrum of the light-emitting unit 140 and the emission spectrum of the absorption layer 170 becomes particularly high.

The absorption layer 170 may be formed by depositing the light absorbing material using a coating method, for example, ink jetting, spin coating or the like, or vapor deposition. In a case where the coating method is used, a solvent to dissolve or disperse the light absorbing material is not particularly limited, but, for example, toluene, ethanol, acetone, isopropyl alcohol, water, sulfuric acid, trifluoroacetic acid, and dodecylbenzenesulfonic acid may be used. In particular, in a case where the light absorbing material contains a metal phthalocyanine, dodecylbenzenesulfonic acid is preferably used as the solvent. In addition, in a case where the coating method is used, the absorption layer 170 may be formed by applying a mixture of a binder and the light absorbing material. The binder is, for example, a resin material, and in this case, the absorption layer 170 is configured including a resin. In a case where the absorption layer 170 includes a resin material, the content of the light absorbing material with respect to the absorption layer 170 is, for example, equal to or greater than 5 mass % and equal to or less than 80 mass %. The thickness of the absorption layer 170 is not particularly limited, but is, for example, equal to or greater than 10 nm and equal to or less than 100 µm.

Meanwhile, in the present embodiment, the sealing film 182 is not required to be provided in the light-emitting device 10. In such a case, the adhesive layer 184 is provided in contact with the second electrode 130.

Figure 6:
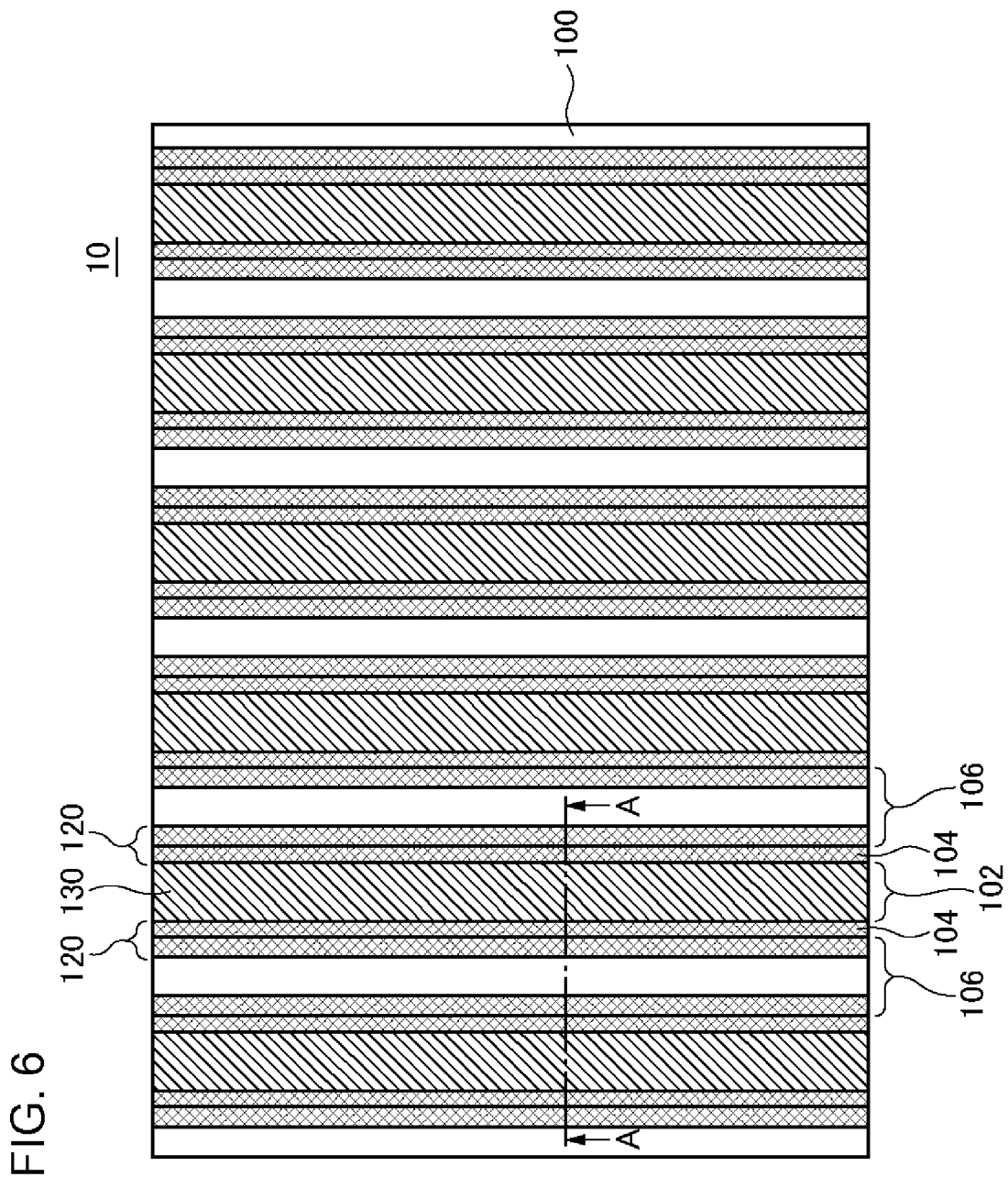
FIG. 6 is a plan view of a light-emitting device.

FIG. 6 is a plan view of the light-emitting device 10. Meanwhile,

FIG. 1 corresponds to a cross-sectional view taken along line A-A of FIG. 6. In the example shown in the present drawing, each of the first region 102, the second region 104, and the third region 106 extends linearly in the same direction as each other. In addition, as illustrated in FIG. 6 and FIG. 1, the second region 104, the first region 102, the second region 104, and the third region 106 are repeatedly aligned in this order.

In the example shown in the present drawing, among the first region 102, the second region 104, and the third region 106, the first region 102 has the lowest light transmittance. Further, the light transmittance of the second region 104 is lower than that of the third region 106 due to the second region 104 including the insulating film 150. In the present embodiment, for example, it is possible to make the width of the second region 104 narrower than that of the third region 106. Then, in the light-emitting device 10, an area occupying ratio of the second region 104 is lower than that of the third region 106, and the light transmittance of the light-emitting device 10 becomes even higher.

Next, a method of manufacturing the light-emitting device 10 will be described. First, the first electrode 110 is formed on the substrate 100 by, for example, sputtering. Then, the first electrode 110 is formed in a predetermined pattern by, for example, photolithography. The insulating film 150 is then formed over an edge of the first electrode 110. For example, in a case where the insulating film 150 is formed of a photosensitive resin, the insulating film 150 is formed in a predetermined pattern by undergoing exposure and development steps. Next, the organic layer 120 and the second electrode 130 are formed in this order. In a case where the organic layer 120 includes a layer formed by vapor deposition, this layer is formed in a predetermined pattern using, for example, a mask or the like. The second electrode 130 is also formed in a predetermined pattern using, for example, a mask. Next, the sealing film 182 is deposited on the light-emitting unit 140. In addition, the sealing member 180 having the absorption layer 170 formed thereon is adhered with the adhesive layer 184 to seal the light-emitting unit 140.

As stated above, in the present embodiment, the light-emitting device 10 includes the light-emitting region located between the plurality of light-emitting units 140. In addition, the second base material 220 includes the absorption layer 170 which corresponds to at least any of the absorption layers described in the above-mentioned first example to fifth example. Therefore, light reflected on the front surface side of the substrate 100, diffused, or the like is absorbed, thereby inhibiting light from being emitted to the rear surface side of the light-emitting device 10. Thus, it is possible to reduce light leaked from the rear surface.

Second Embodiment

Figure 7:
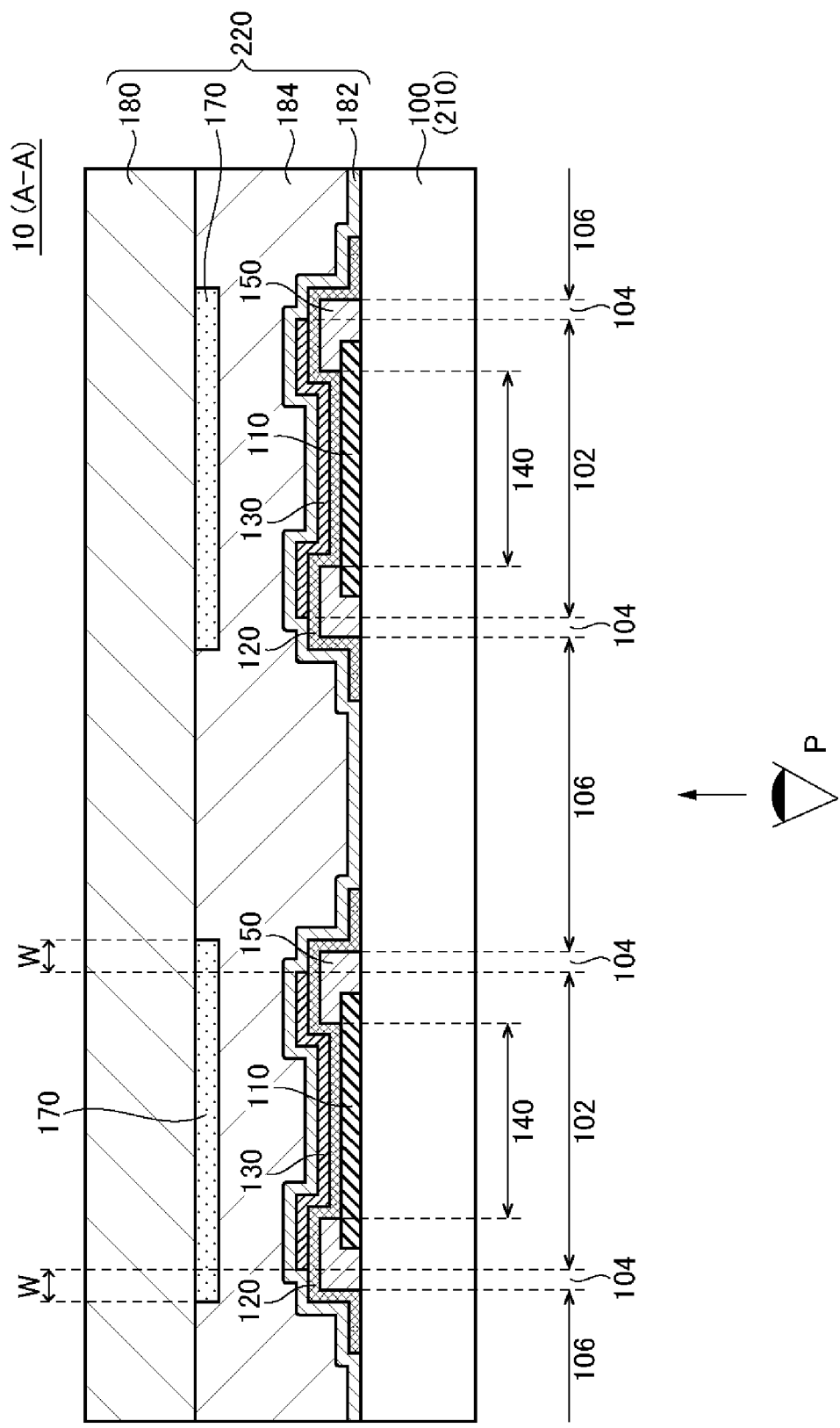
FIG. 7 is a cross-sectional view of a configuration of a light-emitting device according to a second embodiment.

FIG. 7 is a cross-sectional view of a configuration of a light-emitting device 10 according to a second embodiment. The present drawing corresponds to FIG. 1 in the first embodiment. The light-emitting device 10 according to the present embodiment is the same as the light-emitting device 10 according to the first embodiment except that the absorption layer 170 is not provided in at least a portion of a region overlapping a light-transmitting region when viewed from a direction perpendicular to a first base material 210.

The absorption layer 170 is formed in at least a region overlapping a light-emitting unit 140 when viewed from the direction perpendicular to the first base material 210. Further, the absorption layer 170 is not provided in at least a portion of a region which overlaps the light-transmitting region. However, the absorption layer 170 is preferably formed to overlap at least the entirety of a first region 102. In the present embodiment, the absorption layers 170 extend linearly in the same direction.

In a case where the absorption layer 170 is formed to overlap at least the entirety of the first region 102, a width W of a portion of the absorption layer 170 protruding from the first region 102 is preferably equal to or greater than 10 μm and equal to or less than 200 μm. Then, it is possible to efficiently reduce light leaked from the rear surface, and at the same time, there is no difficulty in alignment. Here, it can also be said that W is the width of a portion of the absorption layer 170 which is further on the outer side of the light-emitting unit 140 than an end of a second electrode 130 in a cross-section perpendicular to a surface of the substrate 100 and perpendicular to the extending direction of the light-emitting unit 140 (corresponds to a cross-section taken along line A-A of FIG. 6).

Figure 8:
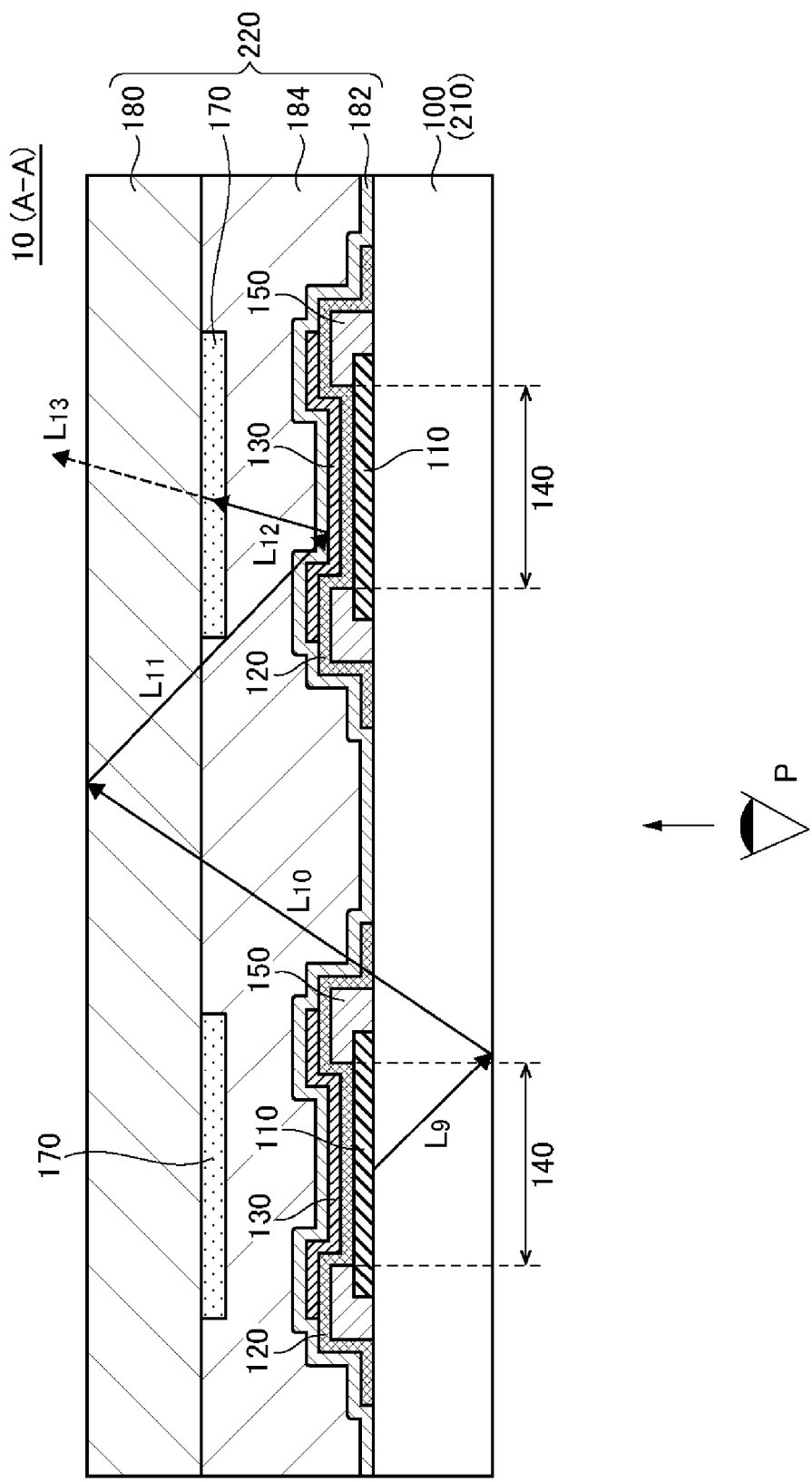
FIG. 8 is a diagram of a second example of a light path in a light-emitting device.

FIG. 8 is a view of a second example of a light path in the light-emitting device 10. The present drawing illustrates a case where light $L_9$ outputted from the light-emitting unit 140 is totally reflected on the front surface side of the light-emitting device 10, further totally reflected on the rear surface side of the light-emitting device 10, and follows the light paths of light $L_{10}$ and light $L_{11}$. Light in the light-emitting device 10 propagates through the light-emitting device 10 and is emitted from a side surface, therefore will not leak from the rear surface, as long as the light keeps maintaining an angle at which the light is totally reflected on the front surface and the rear surface of the light-emitting device 10. However, the light-emitting unit 140 is provided in the light-emitting device 10, and particularly light $L_{12}$ reflected by irregularities and the like on the rear surface side of the second electrode 130 may have the angle at which the light can be emitted from the rear surface of the light-emitting device 10. Therefore, the light leaked from the rear surface may particularly increase in a region overlapping the light-emitting unit 140. In contrast, in the light-emitting device 10 according to the present embodiment, the absorption layer 170 is provided in at least a region overlapping the light-emitting unit 140. Therefore, it is possible to efficiently reduce light leaked from the rear surface as illustrated with $L_{13}$ and to improve light transmittance in the light-transmitting region.

A method of manufacturing the light-emitting device 10 in the present embodiment will be described. First, from forming the light-emitting unit 140 on the substrate 100, to providing a sealing film 182 on the light-emitting unit 140 may be performed as the first embodiment. Next, a sealing member 180 having the absorption layer 170 formed thereon is adhered with an adhesive layer 184 to seal the light-emitting unit 140. In the present embodiment, when forming the absorption layer 170 on a surface of the sealing member 180, patterning is conducted on the absorption layer 170 by, for example, a mask pattern, photolithography, ink jetting, or the like. Further, when fixing the sealing member 180 on the light-emitting unit 140, the absorption layer 170 is aligned to be located to cover the light-emitting unit 140 using an alignment mark or the like.

Meanwhile, the absorption layer 170 may be formed on at least one surface of the sealing member 180. That is, the absorption layer 170 may be formed on both surfaces of the sealing member 180, or the absorption layer 170 may be provided on a surface of the sealing member 180 on a side opposite to the light-emitting unit 140.

As stated above, in the present embodiment also, the light-emitting device 10 includes the light-emitting region located between the plurality of light-emitting units 140. In addition, a second base material 220 includes the absorption layer 170 which corresponds to at least any of the absorption layers described in the above-mentioned first example to fifth example. Therefore, light reflected on the front surface side of the substrate 100 and diffused or the like is absorbed, thereby inhibiting light from being emitted to the rear surface side of the light-emitting device 10. Thus, it is possible to reduce light leaked from the rear surface.

In addition, the absorption layer 170 is formed at least in a region overlapping the light-emitting unit 140 when viewed from the direction perpendicular to the first base material 210. Further, the absorption layer 170 is not provided in at least a portion of a region which overlaps the light-transmitting region. Therefore, it is possible to secure high optical transparency of the light-emitting device 10.

Third Embodiment

Figure 9:
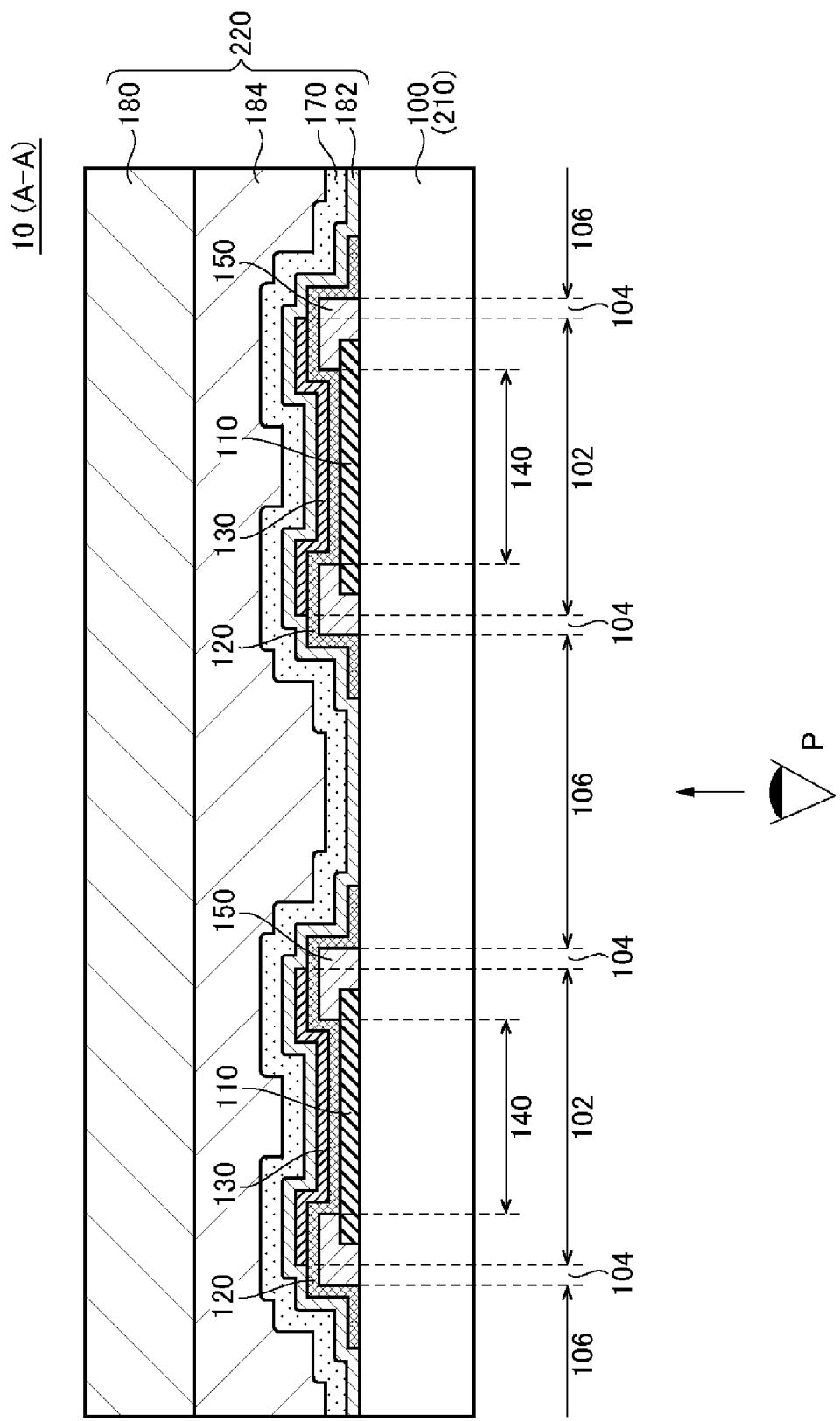
FIG. 9 is a cross-sectional view of a configuration of a light-emitting device according to a third embodiment.

FIG. 9 is a cross-sectional view of a configuration of a light-emitting device 10 according to a third embodiment. The present drawing corresponds to FIG. 1 in the first embodiment. The light-emitting device 10 according to the present embodiment is the same as the light-emitting device 10 according to at least any of the first embodiment and the second embodiment, except for points described below.

In the present embodiment, an absorption layer 170 is formed between a sealing film 182 and an adhesive layer 184, and in the example in the drawing, the absorption layer 170 is in contact with the sealing film 182 and the adhesive layer 184.

A method of manufacturing the light-emitting device 10 in the present embodiment will be described. Steps from forming the light-emitting unit 140 on the substrate 100 to providing the sealing film 182 on the light-emitting unit 140 can be performed similarly to the first embodiment. Next, the absorption layer 170 is formed on the sealing film 182. As is the case with the description in the first embodiment, the absorption layer 170 may be deposited using a coating method, for example, ink jetting, spin coating or the like, or by vapor deposition. Next, the sealing member 180 is fixed to the absorption layer 170 with the adhesive layer 184.

Meanwhile, the absorption layer 170 may further be provided on at least one surface of the sealing member 180 as is the case with the first embodiment or the second embodiment. In addition, the absorption layer 170 may be provided between the light-emitting unit 140 and the sealing film 182.

Further, the light-emitting device 10 need not have the sealing film 182. In a case where the light-emitting device 10 does not include the sealing film 182, the absorption layer 170 is formed between the light-emitting unit 140 and the adhesive layer 184, and the absorption layer 170 is provided in contact with the second electrode 130.

As stated above, in the present embodiment also, the light-emitting device 10 includes a light-emitting region located between a plurality of light-emitting units 140. Then, the second base material 220 includes the absorption layer 170 which corresponds to at least any of the absorption layers described in the above-mentioned first example to fifth example. Therefore, light reflected on the front surface side of the substrate 100 and diffused or the like is absorbed, thereby inhibiting light from being emitted to the rear surface side of the light-emitting device 10. Thus, it is possible to reduce light leaked from the rear surface.

Fourth Embodiment

Figure 10:
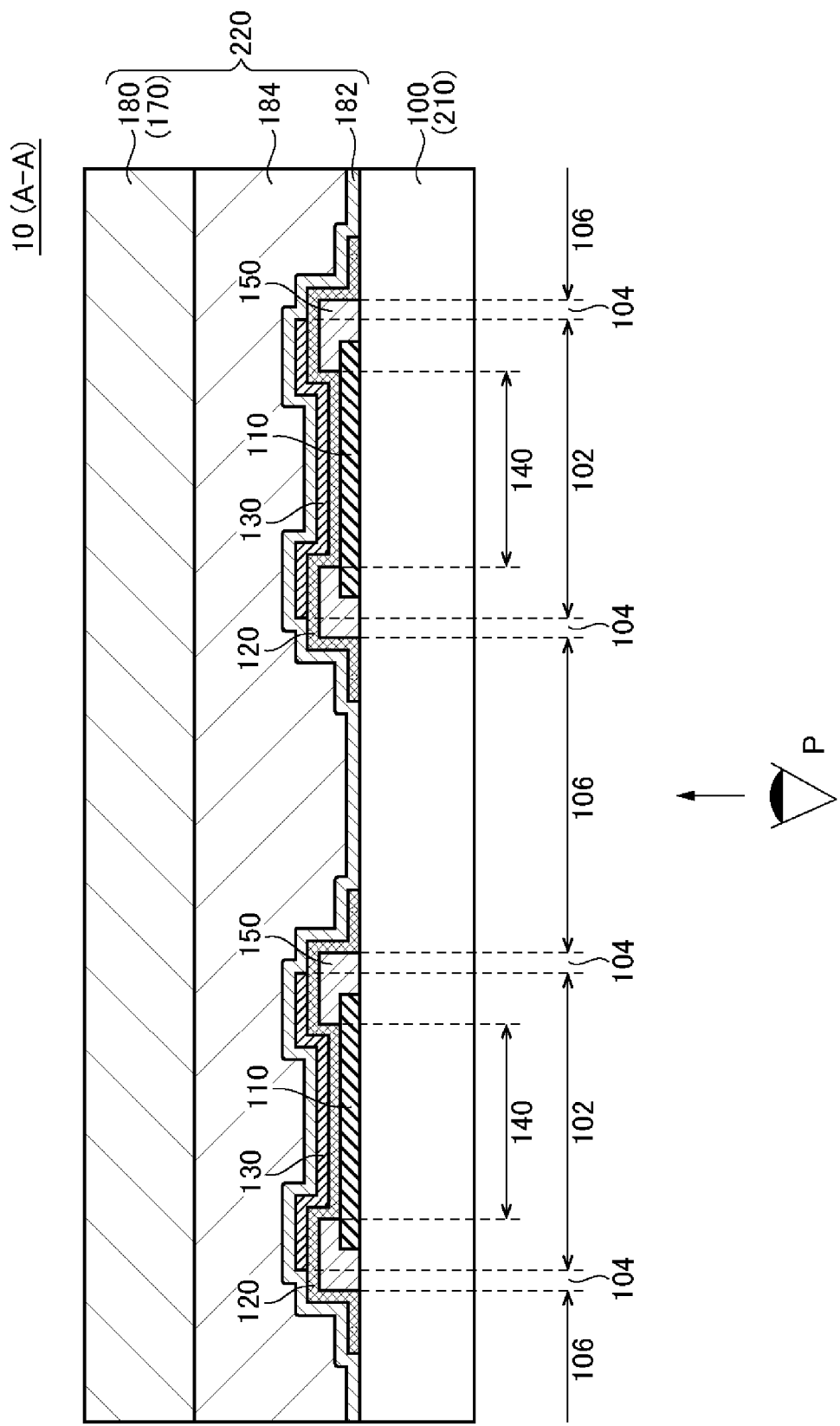
FIG. 10 is a cross-sectional view of a configuration of a light-emitting device according to a fourth embodiment.

FIG. 10 is a cross-sectional view of a configuration of a light-emitting device 10 according a fourth embodiment. The present drawing corresponds to FIG. 1 in the first embodiment. The light-emitting device 10 according to the present embodiment is the same as the light-emitting device 10 according to at least any of the first to third embodiments, except for points described below.

In the present embodiment, at least any of a sealing film 182, an adhesive layer 184, and a sealing member 180 is an absorption layer 170. An example that the sealing member is the absorption layer 170 is illustrated in FIG. 10.

In the present embodiment, a second base material 220 includes the sealing member 180 which covers a light-emitting unit 140 with the adhesive layer 184 interposed therebetween. In a case where at least one of the sealing member 180 and the adhesive layer 184 is the absorption layer 170, by mixing a light absorbing material into a resin material which forms the sealing member 180 or the adhesive layer 184, it is possible to make the sealing member 180 or the adhesive layer 184 function as the absorption layer 170.

That is, in a case where the sealing member 180 is the absorption layer 170, the sealing member 180 is obtained by being formed with a mixed material of the resin material and the light absorbing material. Then, the light-emitting unit 140 is sealed using the sealing member 180. In addition, in a case where the adhesive layer 184 is the absorption layer 170, the region between the sealing member 180 and the light-emitting unit 140 is adhered with an epoxy resin or the like having the light absorbing material mixed therein.

Further, in the present embodiment, the second base material 220 includes the sealing film 182 which covers and is in contact with the light-emitting unit 140. In a case where the sealing film 182 is the absorption layer 170, the sealing film 182 may be formed by, for example, co-deposition of an inorganic insulating material such as SiO, $SiO_2$, $TiO_2$, and $Al_2O_3$, and the above-mentioned light absorbing material. In particular, the inorganic insulating material may be deposited by EB vapor deposition or the like, and an absorption material may be deposited by resistance heating vapor deposition.

Meanwhile, in the present embodiment, the light-emitting device 10 need not include at least any of the sealing member 180, the adhesive layer 184, and the sealing film 182.

As stated above, in the present embodiment also, the light-emitting device 10 includes a light-transmitting region located between a plurality of light-emitting units 140. In addition, the second base material 220 includes the absorption layer 170 which corresponds to at least any of the absorption layers described in the above-mentioned first example to fifth example. Therefore, light reflected on the front surface side of the substrate 100 and diffused or the like is absorbed, thereby inhibiting light from being emitted to the rear surface side of the light-emitting device 10. Thus, it is possible to reduce light leaked from the rear surface.

In addition, in the light-emitting device 10 in the present embodiment, at least one of the sealing member 180 and the adhesive layer 184 is the absorption layer 170, or the sealing film 182 is the absorption layer 170. Therefore, since it is not necessary to provide the absorption layer 170 which is separate from the sealing structure, it is possible to reduce a burden in manufacturing.

Fifth Embodiment

Figure 11:
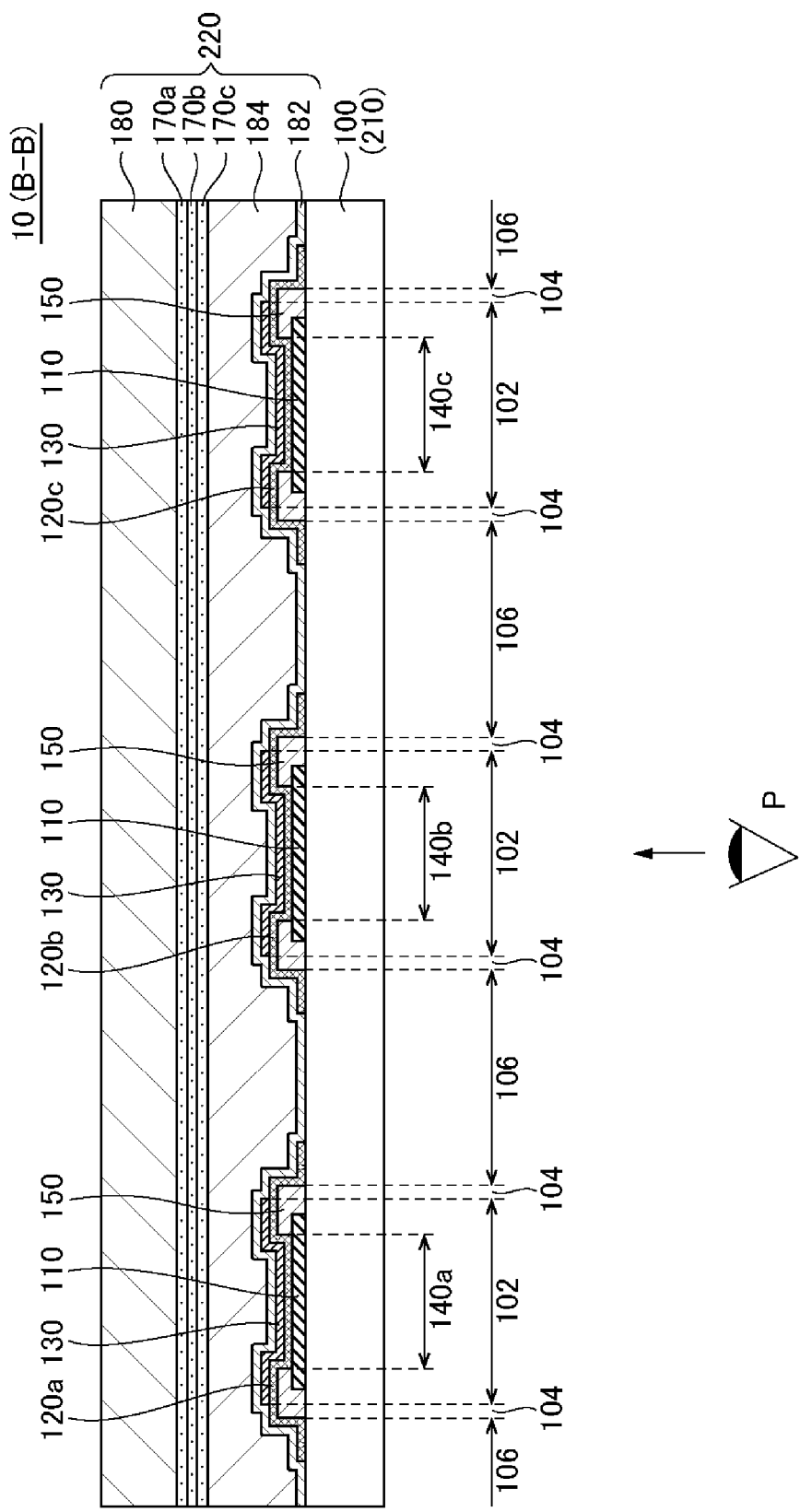
FIG. 11 is a cross-sectional view of a configuration of a light-emitting device according to a fifth embodiment.
Figure 12:
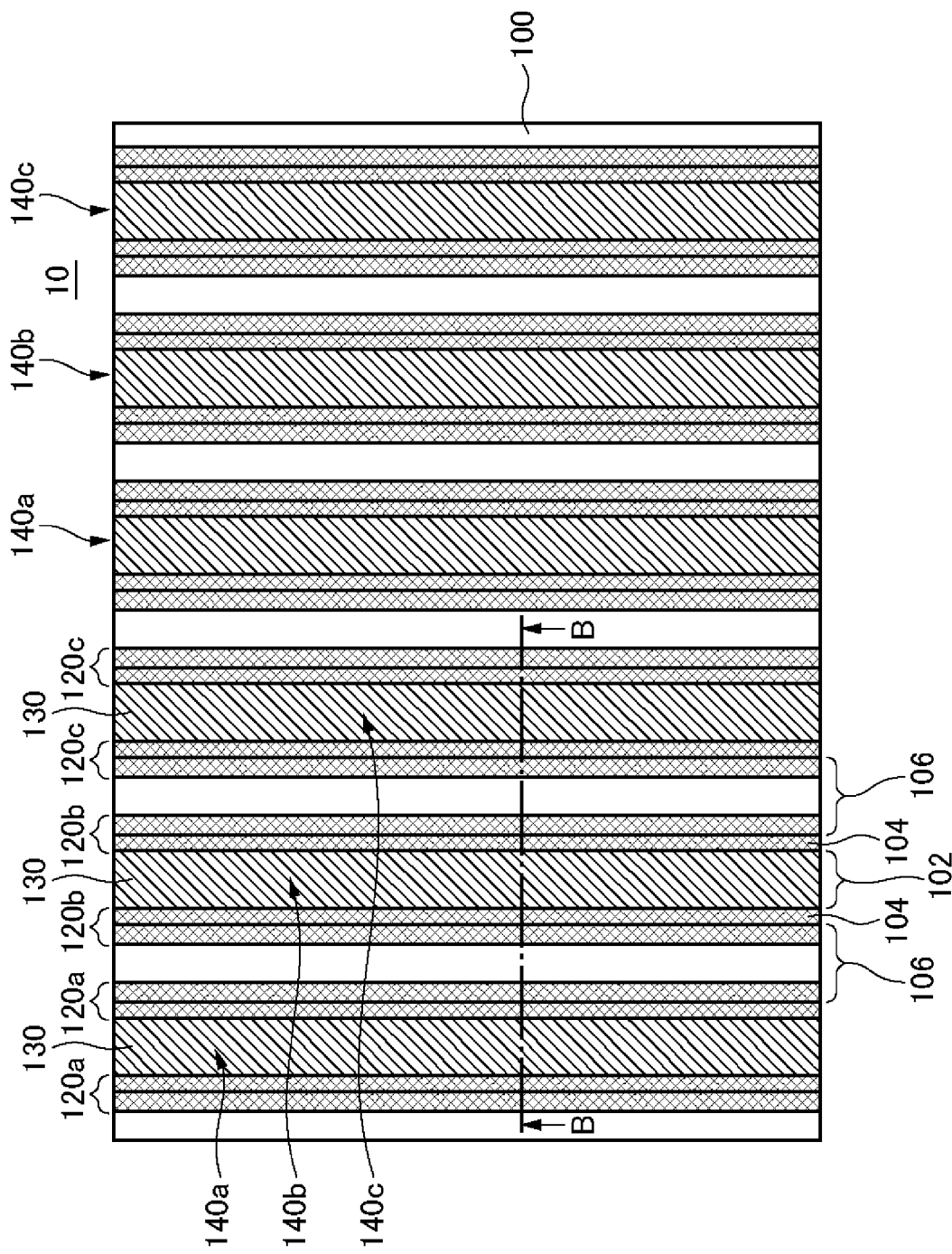
FIG. 12 is a plan view of a light-emitting device according to the fifth embodiment.

FIG. 11 is a cross-sectional view of a configuration of a light-emitting device 10 according to a fifth embodiment. The present drawing corresponds to FIG. 1 in the first embodiment. FIG. 12 is a plan view of the light-emitting device 10 according to the fifth embodiment. Meanwhile, FIG. 11 corresponds to a cross-sectional view taken along line B-B of FIG. 12. The light-emitting device 10 according to the present embodiment is the same as the light-emitting device 10 according to at least any of first to fourth embodiments, except for points described below.

The light-emitting device 10 in the present embodiment includes a first light-emitting unit 140a, and a second light-emitting unit 140b having a wavelength different from that of the first light-emitting unit 140a. In an example illustrated in FIG. 11 and FIG. 12, the light-emitting device 10 includes the first light-emitting unit 140a, the second light-emitting unit 140b, and a third light-emitting unit 140c as light-emitting units 140. The first light-emitting unit 140a includes a first organic layer 120a, the second light-emitting unit 140b includes a second organic layer 120b, and the third light-emitting unit 140c includes a third organic layer 120c. Each emission color of the first light-emitting unit 140a, the second light-emitting unit 140b, and the third light-emitting unit 140c is different from each other, that is, each first wavelength is different from the other.

For example, the emission spectrum peak wavelength of the first light-emitting unit 140a (the first wavelength of the first light-emitting unit 140a) is longer than the emission spectrum peak wavelength of the second light-emitting unit 140b (the first wavelength of the second light-emitting unit 140b). In addition, the emission spectrum peak wavelength of the second light-emitting unit 140b is longer than the emission spectrum peak wavelength of the third light-emitting unit 140c (the first wavelength of the third light-emitting unit 140c). The emission color of the first light-emitting unit 140a is, for example, red, and the first wavelength of the first light-emitting unit 140a is, for example, equal to or greater than 590 nm and equal to or less than 680 nm. The emission color of the second light-emitting unit 140b is, for example, green, and the first wavelength of the second light-emitting unit 140b is, for example, equal to or greater than 490 nm and equal to or less than 580 nm. The emission color of the third light-emitting unit 140c is, for example, blue, and the first wavelength of the third light-emitting unit 140c is, for example, equal to or greater than 390 nm and equal to or less than 480 nm.

In addition, as illustrated in FIG. 11 and FIG. 12, the first light-emitting unit 140a, the second light-emitting unit 140b, and the third light-emitting unit 140c are repeatedly aligned in order.

As described, since the light-emitting device 10 includes the first light-emitting unit 140a, the second light-emitting unit 140b, and the third light-emitting unit 140c which generate the emission colors different from each other, the light-emitting device 10 may be used as white illumination or color illumination. Further, the color of the entire light-emitting device 10 may be adjusted by adjusting each light emission of the first light-emitting unit 140a, the second light-emitting unit 140b, and the third light-emitting unit 140c independently.

The light-emitting device 10 according to the present embodiment includes a first absorption layer 170a, a second absorption layer 170b, and a third absorption layer 170c as the absorption layer 170. The first absorption layer 170a is a layer that particularly absorbs light of the first wavelength of the first light-emitting unit 140a, the second absorption layer 170b is a layer that particularly absorbs light of the first wavelength of the second light-emitting unit 140b, and the third absorption layer 170c is a layer that particularly absorbs light of the first wavelength of the third light-emitting unit 140c. Each of a relationship between the first absorption layer 170a and the first wavelength of the first light-emitting unit 140a, a relationship between the second absorption layer 170b and the first wavelength of the second light-emitting unit 140b, and a relationship between the third absorption layer 170c and the first wavelength of the third light-emitting unit 140c corresponds to at least any of the relationships between the absorption layer 170 and the light-emitting unit 140 in the first example to the fifth example explained in the first embodiment.

A laminate of the first absorption layer 170a, the second absorption layer 170b, and the third absorption layer 170c absorbs the first wavelength of the first light-emitting unit 140a, the second light-emitting unit 140b, and the third light-emitting unit 140c.

Meanwhile, the laminate as a whole has optical transparency. Therefore, it is possible to secure visibility from the front surface side to the rear surface side and from the rear surface side to the front surface side of the light-emitting device 10.

In the example illustrated in FIG. 11, the first absorption layer 170a, the second absorption layer 170b, and the third absorption layer 170c are laminated in this order, but a laminating order of the first absorption layer 170a, the second absorption layer 170b, and the third absorption layer 170c is not particularly limited. In addition, in the example shown in the present drawing, the first absorption layer 170a, the second absorption layer 170b, and the third absorption layer 170c are provided in contact with each other. However, another layer may be provided between the first absorption layer 170a, the second absorption layer 170b, and the third absorption layer 170c.

In addition, in the example shown in FIG. 11, when viewed from a direction perpendicular to the first base material 210, the first absorption layer 170a, the second absorption layer 170b, and the third absorption layer 170c are provided to overlap the entirety of the first region 102, the second region 104, and a third region 106, but it is not limited thereto. As is the case with the second embodiment, in at least a portion of a region overlapping a light-transmitting region, at least any of the first absorption layer 170a, the second absorption layer 170b, and the third absorption layer 170c need not be provided.

As stated above, in the present embodiment also, the light-emitting device 10 includes the light-transmitting region located between a plurality of light-emitting units 140. In addition, the second base material 220 includes the absorption layer 170 which corresponds to at least any of the absorption layers described in the above-mentioned first example to fifth example. Therefore, light reflected on the front surface side of the substrate 100 and diffused or the like is absorbed, thereby inhibiting light from being emitted to the rear surface side of the light-emitting device 10. Thus, it is possible to reduce light leaked from the rear surface.

In addition, the light-emitting device 10 in the present embodiment includes at least the first light-emitting unit 140a, and the second light-emitting unit 140b having a wavelength different from that of the first light-emitting unit 140a. Therefore, the color of the entire light-emitting device 10 may be adjusted.

Example 1

Figure 13:
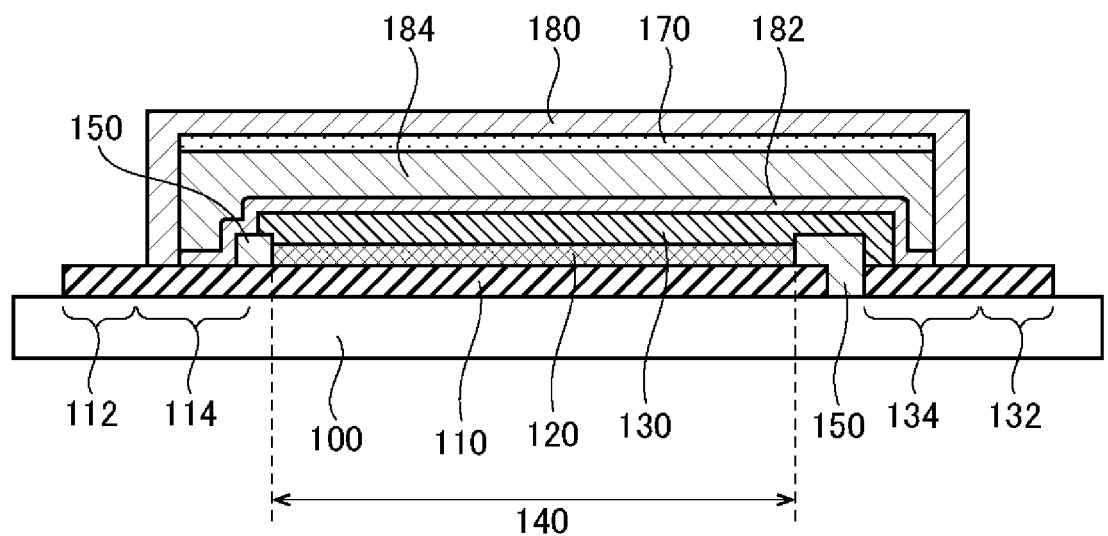
FIG. 13 is a cross-sectional view of a configuration of a light-emitting device according to Example 1.
Figure 14:
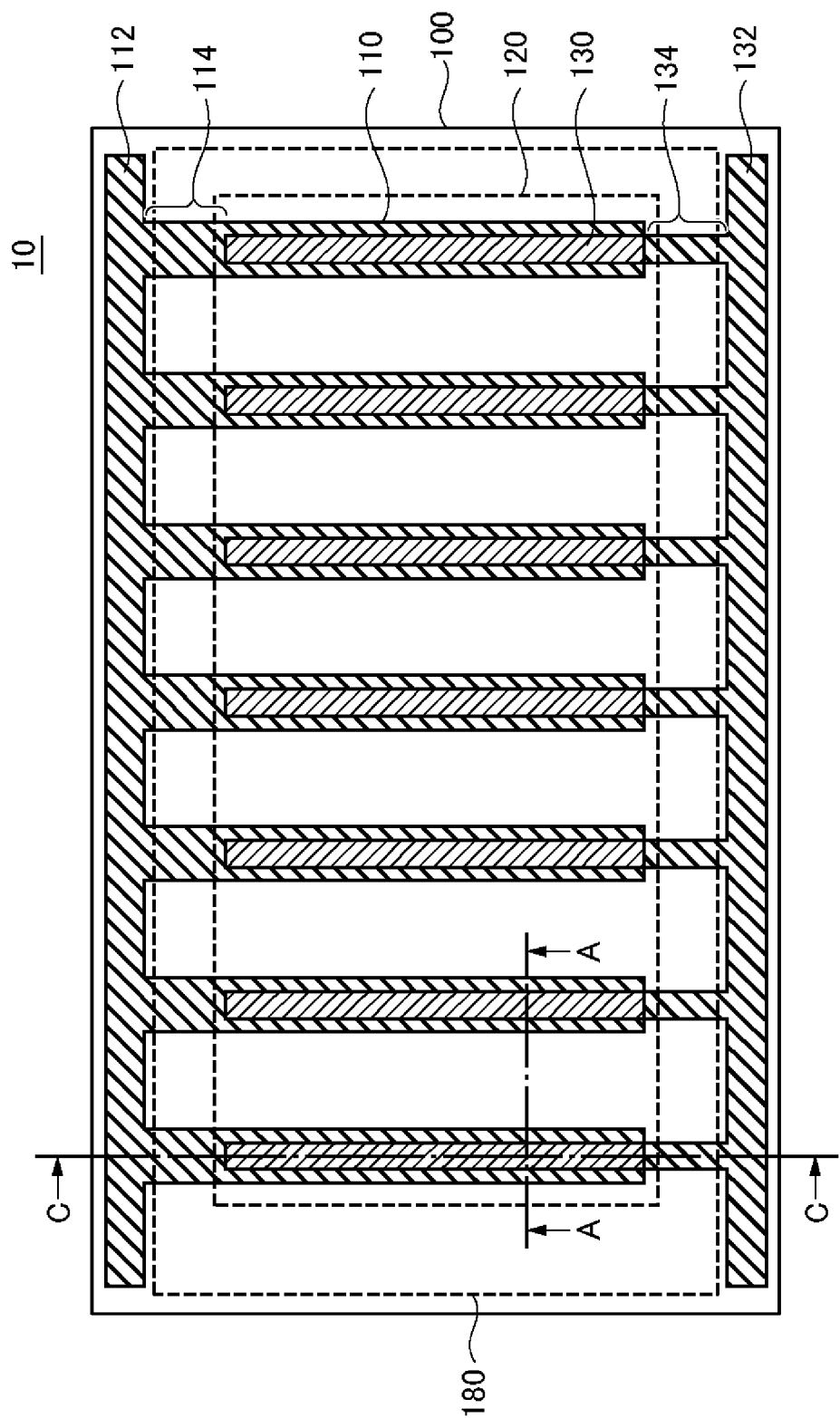
FIG. 14 is a plan view of the light-emitting device illustrated in FIG. 13.

FIG. 13 is a cross-sectional view of a configuration of a light-emitting device 10 according to Example 1. FIG. 14 is a plan view of the light-emitting device 10 illustrated in FIG. 13. However, a part of members is not illustrated in FIG. 14. FIG. 13 corresponds to a cross-sectional view taken along line C-C of FIG. 14. The light-emitting device 10 according to the present example includes the same configuration as that of the light-emitting device 10 according to at least any of first to fifth embodiments. Meanwhile, an example of the light-emitting device 10 including a configuration of the first embodiment is illustrated in FIG. 13 and FIG. 14. FIG. 1 corresponds to a cross-sectional view taken along line A-A of FIG. 14.

Further, the light-emitting device 10 includes a first terminal 112, a first lead-out wiring 114, a second terminal 132, and a second lead-out wiring 134. Each of the first terminal 112, the first lead-out wiring 114, the second terminal 132, and the second lead-out wiring 134 is formed on the same surface as the surface of the substrate 100 on which the light-emitting unit 140 is formed. The first terminal 112 and the second terminal 132 are located outside the sealing member 180. The first lead-out wiring 114 connects the first terminal 112 to the first electrode 110, and the second lead-out wiring 134 connects the second terminal 132 to the second electrode 130. In other words, both of the first lead-out wiring 114 and the second lead-out wiring 134 extend from the inside to the outside of the sealing member 180.

The first terminal 112, the second terminal 132, the first lead-out wiring 114, and the second lead-out wiring 134 have, for example, a layer formed of the same material as that of the first electrode 110. Further, at least a portion of at least one of the first terminal 112, the second terminal 132, the first lead-out wiring 114, and the second lead-out wiring 134 may include thereon a metal film having a lower resistance than the first electrode 110. This metal film has, for example, a configuration in which a first metal layer of Mo, a Mo alloy, or the like, a second metal layer of Al, an Al alloy, or the like, and a third metal layer of Mo, a Mo alloy, or the like are laminated in this order. It is not necessary that the metal film is formed on each of the first terminal 112, the second terminal 132, the first lead-out wiring 114, and the second lead-out wiring 134.

A layer formed of the same material as that of the first electrode 110 among the first terminal 112, the first lead-out wiring 114, the second terminal 132, and the second lead-out wiring 134 is formed in the same step as that of forming the first electrode 110. Therefore, the first electrode 110 is formed integrally with at least a portion of the layer of the first terminal 112. In addition, in a case where these include the metal film, this metal film is formed by, for example, a film formation by sputtering and patterning by etching or the like. In this case, a light transmittance of the first terminal 112, the first extraction interconnect 114, the second terminal 132, and the second extraction interconnect 134 is lower than that of the substrate 100.

In the example shown in the drawing, one first lead-out wiring 114 and one second lead-out wiring 134 are formed for each light-emitting unit 140. Each of the plurality of first lead-out wirings 114 is connected to the same first terminal 112, and each of the plurality of second lead-out wirings 134 is connected to the same second terminal 132. A positive electrode terminal of a control circuit is connected to the first terminal 112 via a conductive member such as a bonding wire, a lead terminal, or the like, and a negative electrode terminal of the control circuit is connected to the second terminal 132 via a conductive member such as a bonding wire, a lead terminal, or the like. However, in a case where the light-emitting device 10 includes a configuration in the fifth embodiment, the light-emitting device 10 may include a plurality of second terminals 132, and the second extraction interconnects 134 may be connected to the second terminals 132 which are different from each other.

As stated above, in the present example also, the light-emitting device 10 includes a light-transmitting region located between a plurality of light-emitting units 140. In addition, the second base material 220 includes the absorption layer 170 which corresponds to at least any of the absorption layers described in the above-mentioned first example to fifth example. Therefore, light reflected on the front surface side of the substrate 100 and diffused or the like is absorbed, thereby inhibiting light from being emitted to the rear surface side of the light-emitting device 10. Thus, it is possible to reduce light leaked from the rear surface.

An example of a bottom-emission type light-emitting device has been shown in the above-mentioned embodiments and example. However, the light-emitting device is not limited thereto. For example, the light-emitting device may be a top-emission type.

As described above, although the embodiments and example of the present invention have been set forth with reference to the accompanying drawings, they are merely illustrative of the present invention, and various configurations other than those stated above can be adopted.

The invention claimed is:

1. A light-emitting device comprising:
a plurality of light-emitting units located between a light-transmitting first base material and a light-transmitting second base material, the light-emitting units emitting light having a peak at a first wavelength; and
a light-transmitting region located between the plurality of light-emitting units, wherein the second base material comprises an absorption layer, and
wherein the absorption layer has a higher light absorption ratio at the first wavelength than an average light absorption ratio within a wavelength range of equal to or higher than 400 nm and equal to or lower than 700 nm.

2. The light-emitting device according to claim 1,
wherein the light-emitting unit comprises a light-transmitting first electrode, a light-shielding second electrode, and an organic layer located between the first electrode and the second electrode, and
wherein the second electrode is located on a side of the first electrode opposite to a side of the first base material.

3. The light-emitting device according to claim 2,
wherein the light-emitting unit comprises the organic layer comprising Btplr.

4. The light-emitting device according to claim 1,
wherein the light absorption ratio of the absorption layer is equal to or less than 50% at a wavelength shorter than the first wavelength by 100 nm and at a wavelength longer than the first wavelength by 100 nm.

5. The light-emitting device according to claim 1,
wherein the first wavelength is equal to or greater than 590 nm and equal to or less than 680, and
wherein the absorption layer comprises metal phthalocyanine.

6. The light-emitting device according to claim 1,
wherein the absorption layer is formed at least in a region overlapping the light-emitting unit when viewed from a direction perpendicular to the first base material.

7. The light-emitting device according to claim 6,
wherein the absorption layer is further formed in a region overlapping the light-transmitting region when viewed from the direction perpendicular to the first base material.

8. The light-emitting device according to claim 1,
wherein the second base material comprises a sealing member that covers the light-emitting unit with an adhesive layer interposed therebetween, and
wherein the absorption layer is in contact with the sealing member.

9. The light-emitting device according to claim 1,
wherein the second base material comprises a sealing member that covers the light-emitting unit with an adhesive layer interposed therebetween, and
wherein at least one of the sealing member and the adhesive layer is the absorption layer.

10. The light-emitting device according to claim 1,
wherein the second base material comprises a sealing film that is in contact with the light-emitting unit and that covers the light-emitting unit, and
wherein the sealing film is the absorption layer.

11. A light-emitting device comprising:
a plurality of light-emitting units located between a light-transmitting first base material and a light-transmitting second base material, the light-emitting units emitting light having a peak at a first wavelength; and
a light-transmitting region located between the plurality of light-emitting units, wherein the second base material comprises an absorption layer, and wherein an absorption ratio of the absorption layer with respect to light within a wavelength range between two wavelengths as upper and lower limits each having an intensity of one half of a peak intensity of the peak at the first wavelength is equal to or greater than 10%.

12. A light-emitting device comprising:

a plurality of light-emitting units located between a light-transmitting first base material and a light-transmitting second base material, the light-emitting units emitting light having a peak at a first wavelength; and a light-transmitting region located between the plurality of light-emitting units, wherein the second base material comprises an absorption layer, and wherein the absorption layer has an absorption peak within a wavelength range between two wavelengths as upper and lower limits each having an intensity of one half of a peak intensity of the peak at the first wavelength.

13. A light-emitting device comprising:

a plurality of light-emitting units located between a light-transmitting first base material and a light-transmitting second base material, the light-emitting units emitting light having a peak at a first wavelength; and a light-transmitting region located between the plurality of light-emitting units, wherein the second base material comprises an absorption layer, and wherein the first wavelength is contained within a wavelength range between two wavelengths as upper and lower limits each having an absorption intensity of one half of a peak intensity at a maximum light absorption peak of the absorption layer.

* * * * *